(12) United States Patent
Kim et al.

(10) Patent No.: US 11,925,055 B2
(45) Date of Patent: *Mar. 5, 2024

(54) ORGANIC LIGHT-EMITTING DIODE DISPLAY

(71) Applicant: Samsung Display Co., Ltd., Yongin-si (KR)

(72) Inventors: Deukjong Kim, Yongin-si (KR); Sunyoul Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/650,696

(22) Filed: Feb. 11, 2022

(65) Prior Publication Data

US 2022/0165988 A1    May 26, 2022

Related U.S. Application Data

(60) Continuation of application No. 16/595,104, filed on Oct. 7, 2019, now Pat. No. 11,258,039, which is a
(Continued)

(30) Foreign Application Priority Data

Jul. 29, 2015    (KR) .................. 10-2015-0107415

(51) Int. Cl.
*H10K 50/844*    (2023.01)
*H01L 27/12*    (2006.01)
(Continued)

(52) U.S. Cl.
CPC ......... *H10K 50/844* (2023.02); *H10K 59/131* (2023.02); *H01L 27/1222* (2013.01);
(Continued)

(58) Field of Classification Search
CPC .... H10K 50/844; H10K 59/131; H10K 50/84; H10K 59/1201; H10K 59/122;
(Continued)

(56) References Cited

U.S. PATENT DOCUMENTS 7,944,140 B2    5/2011    Kwak et al.
8,258,696 B2    9/2012    Oh et al.
(Continued)

FOREIGN PATENT DOCUMENTS

CN    101355096    1/2009
CN    104517999    4/2015
(Continued)

*Primary Examiner* — Mohammed Shamsuzzaman
(74) *Attorney, Agent, or Firm* — F. CHAU & ASSOCIATES, LLC

(57) ABSTRACT

An organic light-emitting diode display is disclosed. In one aspect, the display includes a display unit located on the substrate and including a display area and a non-display area surrounding the display area, and a thin film encapsulation layer sealing the display unit. The display also includes a voltage line formed in the non-display area and surrounding the display area, a metal layer formed of the same material as the voltage line, and a dam surrounding the display area and contacting the voltage line. The voltage line includes a first voltage line disposed in one side of the display area. The first voltage line includes a pair of first end portions and a pair of first connectors respectively connected to the pair of first end portions and extending away from the display area. The metal layer is disposed between the pair of first connectors. The dam contacts the metal layer.

20 Claims, 12 Drawing Sheets

Related U.S. Application Data continuation of application No. 15/920,341, filed on Mar. 13, 2018, now Pat. No. 10,468,628, which is a division of application No. 15/156,232, filed on May 16, 2016, now Pat. No. 9,954,200.

(51) Int. Cl.
| | |
|---|---|
| *H10K 59/131* | (2023.01) |
| *H01L 29/786* | (2006.01) |
| *H10K 50/84* | (2023.01) |
| *H10K 59/12* | (2023.01) |
| *H10K 59/122* | (2023.01) |
| *H10K 59/124* | (2023.01) |
| *H10K 102/00* | (2023.01) |

(52) U.S. Cl.
CPC ........ *H01L 27/124* (2013.01); *H01L 27/1248* (2013.01); *H01L 29/78675* (2013.01); *H01L 29/78678* (2013.01); *H10K 50/84* (2023.02); *H10K 59/1201* (2023.02); *H10K 59/122* (2023.02); *H10K 59/124* (2023.02); *H10K 2102/351* (2023.02)

(58) Field of Classification Search
CPC ........... H10K 59/124; H10K 2102/351; H10K 59/87; H01L 27/1222; H01L 27/124; H01L 27/1248; H01L 29/78675; H01L 29/78678; Y02P 70/50
See application file for complete search history.

(56) References Cited

U.S. PATENT DOCUMENTS

| | | | |
|---|---|---|---|
| 9,006,970 B2 | 4/2015 | Song et al. | |
| 9,450,034 B2 | 9/2016 | Lee et al. | |
| 9,954,200 B2 | 4/2018 | Kim et al. | |
| 9,972,693 B2 | 5/2018 | Kim et al. | |
| 10,411,083 B2* | 9/2019 | Song | H10K 59/1213 |
| 10,468,628 B2 | 11/2019 | Kim et al. | |
| 11,302,221 B2* | 4/2022 | Song | G02F 1/133305 |
| 2005/0046347 A1 | 3/2005 | Kato et al. | |
| 2007/0222375 A1* | 9/2007 | Liu | H10K 59/38 |
| | | | 313/506 |
| 2008/0012008 A1* | 1/2008 | Song | H10K 71/60 |
| | | | 438/151 |
| 2010/0045181 A1 | 2/2010 | Oh et al. | |
| 2010/0157412 A1 | 6/2010 | Lee et al. | |
| 2010/0244057 A1 | 9/2010 | Ryu et al. | |
| 2011/0012606 A1 | 1/2011 | Seo et al. | |
| 2011/0031479 A1 | 2/2011 | Ryu et al. | |
| 2011/0114991 A1* | 5/2011 | Lee | H10K 50/8426 |
| | | | 257/E33.059 |
| 2011/0272714 A1 | 11/2011 | Lhee | |
| 2011/0279434 A1* | 11/2011 | Akimoto | G09G 3/3258 |
| | | | 345/211 |
| 2012/0112212 A1 | 5/2012 | Kim | |
| 2013/0201575 A1* | 8/2013 | Cheon | F21V 11/00 |
| | | | 359/893 |
| 2013/0249877 A1* | 9/2013 | Choi | H10K 50/844 |
| | | | 345/205 |
| 2014/0022230 A1* | 1/2014 | Hasumi | H10K 59/131 |
| | | | 345/212 |
| 2014/0061606 A1* | 3/2014 | Kim | H10K 59/123 |
| | | | 257/40 |
| 2014/0097419 A1* | 4/2014 | Kim | H10K 59/121 |
| | | | 438/46 |
| 2014/0132148 A1 | 5/2014 | Jang et al. | |
| 2014/0354700 A1* | 12/2014 | Hong | G09G 3/3233 |
| | | | 345/82 |
| 2014/0367705 A1* | 12/2014 | Bibl | H01L 33/0008 |
| | | | 438/27 |
| 2015/0041791 A1 | 2/2015 | Lee et al. | |
| 2015/0155520 A1* | 6/2015 | Kim | H10K 59/805 |
| | | | 257/40 |
| 2015/0179099 A1* | 6/2015 | Go | H10K 71/00 |
| | | | 345/82 |
| 2015/0179720 A1* | 6/2015 | Go | H10K 59/124 |
| | | | 438/23 |
| 2015/0380685 A1* | 12/2015 | Lee | H10K 50/8423 |
| | | | 257/40 |
| 2016/0172427 A1* | 6/2016 | Lee | H10K 59/131 |
| | | | 257/40 |
| 2016/0172623 A1* | 6/2016 | Lee | B32B 27/32 |
| | | | 257/40 |
| 2016/0190503 A1* | 6/2016 | Chang | H10K 77/10 |
| | | | 257/40 |
| 2016/0268540 A1* | 9/2016 | Kim | H10K 50/8445 |
| 2016/0307971 A1* | 10/2016 | Jeon | G09G 3/3233 |
| 2016/0315284 A1* | 10/2016 | Jeon | H10K 50/8426 |
| 2016/0336541 A1* | 11/2016 | Kim | H10K 50/8426 |
| 2016/0365398 A1* | 12/2016 | Kim | H10K 50/8426 |
| 2017/0033312 A1* | 2/2017 | Kim | H10K 59/131 |
| 2017/0053973 A1* | 2/2017 | Park | H10K 50/844 |
| 2017/0125392 A1* | 5/2017 | Bibl | H01L 27/124 |
| 2018/0205037 A1 | 7/2018 | Kim et al. | |
| 2020/0044193 A1 | 2/2020 | Kim et al. | |

FOREIGN PATENT DOCUMENTS

| | | |
|---|---|---|
| CN | 106252379 | 12/2016 |
| JP | 2005-78979 | 3/2005 |
| JP | 2006114399 | 4/2006 |
| JP | 4810587 | 8/2011 |
| JP | 4981101 | 4/2012 |
| JP | 5989342 | 8/2016 |
| KR | 20-2008-0003962 | 9/2008 |
| KR | 10-2010-0047367 | 5/2010 |
| KR | 10-2010-0073938 | 7/2010 |
| KR | 10-2011-0007654 | 1/2011 |
| KR | 10-2011-0015205 | 2/2011 |
| KR | 10-2011-0123123 | 11/2011 |
| KR | 10-1097317 | 12/2011 |
| KR | 10-2012-0049021 | 5/2012 |
| KR | 10-2014-0013902 | 2/2014 |
| KR | 10-2014-0061095 | 5/2014 |
| KR | 10-2015-0027407 | 3/2015 |

* cited by examiner

ORGANIC LIGHT-EMITTING DIODE DISPLAY

CROSS REFERENCE TO RELATED APPLICATIONS

This application is a continuation of U.S. application Ser. No. 16/595,104, filed on Oct. 7, 2019, which is a continuation of U.S. application Ser. No. 15/920,341, filed on Mar. 13, 2018, which is a divisional of U.S. patent application Ser. No. 15/156,232, entitled ORGANIC LIGHT-EMITTING DIODE DISPLAY, and filed on May 16, 2016, which claims priority from Korean Patent Application No. 10-2015-0107415, filed on Jul. 29, 2015 in the Korean Intellectual Property Office, the disclosure of which is incorporated herein in its entirety by reference.

BACKGROUND

Technical Field

The described technology generally relates to an organic light-emitting diode (OLED) display.

Discussion of the Related Technology

An OLED display generally includes a hole injection electrode, an electron injection electrode, and an OLED disposed therebetween. Excitons are generated when holes emitted from the hole injection electrode and electrons emitted from the electron injection electrode combine in the organic emission layer, and these excitons emit light.

OLED displays are designed to be driven with a low voltage and manufactured to be light and thin. Also, these displays have favorable characteristics such as wide viewing angles, high contrast, and rapid refresh rates and thus have drawn attention as next-generation display devices. However, since OLED characteristics are likely to degrade due to environmental conditions like external moisture, oxygen, etc., the OLEDs should be protected against the environment.

SUMMARY

One inventive aspect relates to OLED displays.

Another aspect is an OLED display that includes a substrate; a display unit located on the substrate and including a display area and a non-display area outside the display area; a thin film encapsulation layer for sealing the display unit; a voltage line formed in the non-display area and surrounding the display area; and a dam unit having at least a part contacting the voltage line, wherein the voltage line includes a first voltage line disposed to correspond to one side of the display area, wherein the first voltage line includes a pair of first end portions and a pair of first connection units respectively connected to the pair of first end portions, wherein a metal layer including the same material as that of the voltage line is disposed between the pair of first connection units, and wherein the dam unit includes at least two dams and has at least a part contacting the metal layer.

The dam unit may include a first dam and a second dam that are spaced apart from each other, wherein the first dam surrounds the display area, and the second dam surrounds the first dam.

A height of the second dam may be higher than that of the first dam.

The metal layer may be insulated from the voltage line.

The display unit may include at least one thin film transistor, and the metal layer may be formed on the same layer as a source electrode and a drain electrode of the thin film transistor.

The metal layer may be located in a lower portion of the dam unit.

The display unit may include a thin film transistor, an organic light-emitting device electrically connected to the thin film transistor, and a planarization layer disposed between the thin film transistor and the organic light-emitting device, and the dam unit is formed on the same layer as the planarization layer.

The display unit further may include a pixel-defining layer defining a pixel area, and the dam unit may include a first layer formed on the same layer as the planarization layer and a second layer formed on the same layer as the pixel-defining layer.

The first layer and the second layer may be integrally formed.

The thin film encapsulation layer may include at least one inorganic layer and at least one organic layer, and the at least one organic layer may be located inside the dam unit.

The voltage line may include a second voltage line surrounding the pair of first end portions and the other sides of the display area, and the second voltage line may include a pair of second end portions bent to surround outer sides of the pair of first end portions and a pair of second end portions in parallel to the pair of first end portions formed in the pair of second end portions.

The dam unit may contact the second voltage line outside of the other sides of the display area, and the dam unit may have a straight line shape outside of the one side of the display area and simultaneously contacts the pair of second end portions, the pair of first connection units, and the metal layer.

The display unit may further include: a pad unit for applying an electrical signal to the display area, the display unit may be disposed outside of the one side of the display area, and the pair of first connection units and the pair of second connection units may be connected to the pad unit.

The metal layer may be continuously formed with the first voltage line.

The first voltage line may extend to a dam formed outermost.

The voltage line may include a second voltage line surrounding the pair of first end portions and the other sides of the display area, and an outer side of the metal layer and an outer side of the second voltage line may be located on the same line outside of the one side of the display area.

The thin film transistor may include an active layer, a gate electrode, a source electrode, and a drain electrode, a gate insulating layer may be disposed between the active layer and the gate electrode, and an interlayer insulating layer may be disposed between the gate electrode and the source electrode and the drain electrode, the gate insulating layer and the interlayer insulating layer may extend to the non-display area, and the thin film encapsulation layer may include at least one inorganic layer that contacts the gate insulating layer or the interlayer insulating layer outside the dam unit.

The at least one inorganic layer may contact a top surface of the substrate by passing by an end portion of the interlayer insulating layer.

Another aspect is an organic light-emitting diode (OLED) display, comprising: a substrate; a display unit located on the substrate and comprising a display area and a non-display area outside the display area; a thin film encapsulation layer sealing the display unit; a voltage line formed in the non-display area and surrounding the display area; a metal layer formed of the same material as the voltage line; and a dam having at least a part contacting the voltage line, wherein the voltage line comprises a first voltage line disposed in one side of the display area, wherein the first voltage line comprises a pair of first end portions and a pair of first connectors respectively connected to the pair of first end portions and extending away from the display area, wherein the metal layer is disposed between the pair of first connectors, and wherein the dam contacts the metal layer.

In the above OLED display, the dam comprises a first dam and a second dam spaced apart from each other, wherein the first dam surrounds the display area, and wherein the second dam surrounds the first dam.

In the above OLED display, the second dam has a height greater than that of the first dam.

In the above OLED display, the metal layer is electrically insulated from the voltage line.

In the above OLED display, the display unit comprises at least one thin film transistor (TFT), wherein the TFT comprises a source electrode and a drain electrode, and wherein the metal layer is formed on the same layer as the source and drain electrodes.

In the above OLED display, the metal layer is located below the dam.

In the above OLED display, the display unit comprises a thin film transistor (TFT), an OLED electrically connected to the TFT, and a planarization layer disposed between the TFT and the OLED, wherein the dam is formed on the same layer as the planarization layer.

In the above OLED display, the display unit further comprises a pixel-defining layer defining a pixel area, wherein the dam comprises a first layer formed on the same layer as the planarization layer and a second layer formed on the same layer as the pixel-defining layer.

In the above OLED display, the first layer and the second layer are integrally formed.

the thin film encapsulation layer is formed of at least one inorganic layer and at least one organic layer, wherein the at least one organic layer is located inside the dam.

In the above OLED display, the voltage line comprises a second voltage line surrounding the pair of first end portions, wherein the second voltage line comprises a pair of second end portions bent to at least partially surround outer sides of the pair of first end portions and a pair of connectors in parallel to the pair of first connectors and extending from the pair of second end portions.

In the above OLED display, the dam contacts the second voltage line outside of the remaining sides of the display area, wherein a portion of the dam has a straight line shape and contacts the pair of second end portions, the pair of first connectors, and the metal layer.

In the above OLED display, the display unit further comprises a pad unit configured to apply an electrical signal to the display area, wherein the pad unit is disposed in the non-display area, and wherein the pair of first connectors and the pair of second connectors are connected to the pad unit.

In the above OLED display, the metal layer is integrally formed with the first voltage line.

In the above OLED display, the dam comprises a plurality of dams, and wherein the first voltage line extends to the outermost dam.

In the above OLED display, the voltage line comprises a second voltage line surrounding the pair of first end portions and the remaining sides of the display area, wherein the metal layer and an outer side of the second voltage line overlap in the depth dimension of the OLED display.

In the above OLED display, the TFT comprises an active layer, a gate electrode, a source electrode, and a drain electrode, wherein the OLED display further comprises: a gate insulating layer disposed between the active layer and the gate electrode; and an interlayer insulating layer disposed between the gate, source and drain electrodes, wherein the gate and interlayer insulating layers extend from the display area to the non-display area, and wherein the thin film encapsulation layer comprises at least one inorganic layer contacting the gate insulating layer or the interlayer insulating layer outside the dam.

In the above OLED display, the at least one inorganic layer has a portion contacting a top surface of the substrate.

Another aspect is an organic light-emitting diode (OLED) display, comprising: a display unit comprising a display area and a non-display area surrounding the display area; a voltage line formed in the non-display area and surrounding the display area; a plurality of dams formed in the non-display area and surrounding the display area; and a metal layer located adjacent to the voltage line, wherein the metal layer and the voltage line overlap the dams in the depth dimension of the OLED display.

In the above OLED display, the voltage line comprises a first voltage line disposed in one side of the display area, wherein the first voltage line comprises a pair of first end portions and a pair of first connectors respectively connected to the pair of first end portions, wherein the metal layer is disposed between the pair of first connectors, and wherein the dams overlap the first connectors in the depth dimension of the OLED display.

In the above OLED display, the voltage line includes a second voltage line overlapping the dams.

DETAILED DESCRIPTION

Figure 1:
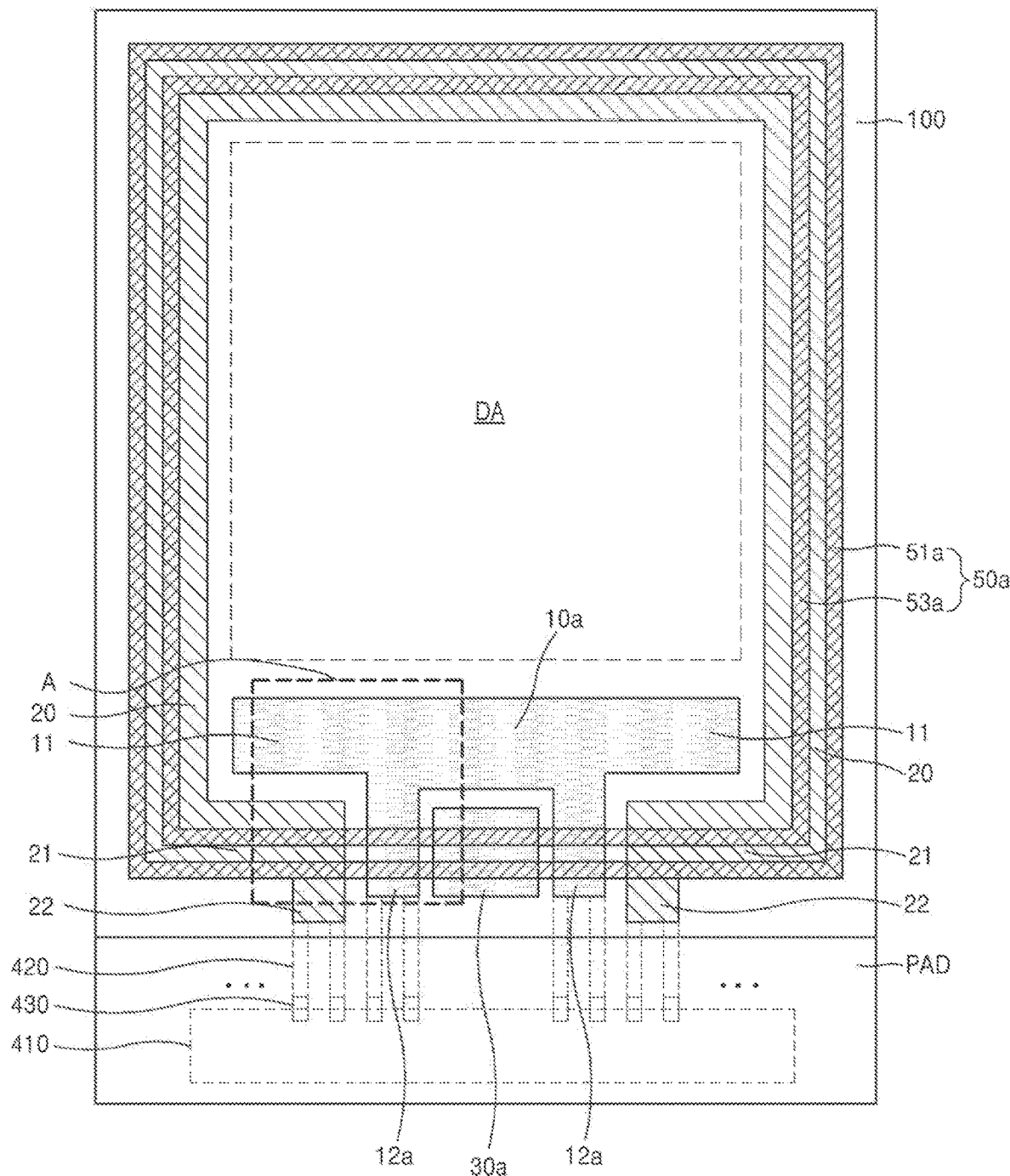
FIG. 1 is a schematic plan view of an OLED display according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Since the described technology may have various modifications and several embodiments, exemplary embodiments are shown in the drawings and will be described in detail. Advantages, features, and a method of achieving the same will be specified with reference to the embodiments described below in detail together with the attached drawings. However, the embodiments may have different forms and should not be construed as being limited to the descriptions set forth herein.

The embodiments of the described technology will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

When an exemplary embodiment is implementable in another manner, a predetermined process order may be different from a described one. For example, two processes that are consecutively described may be substantially simultaneously performed or may be performed in an opposite order to the described order. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
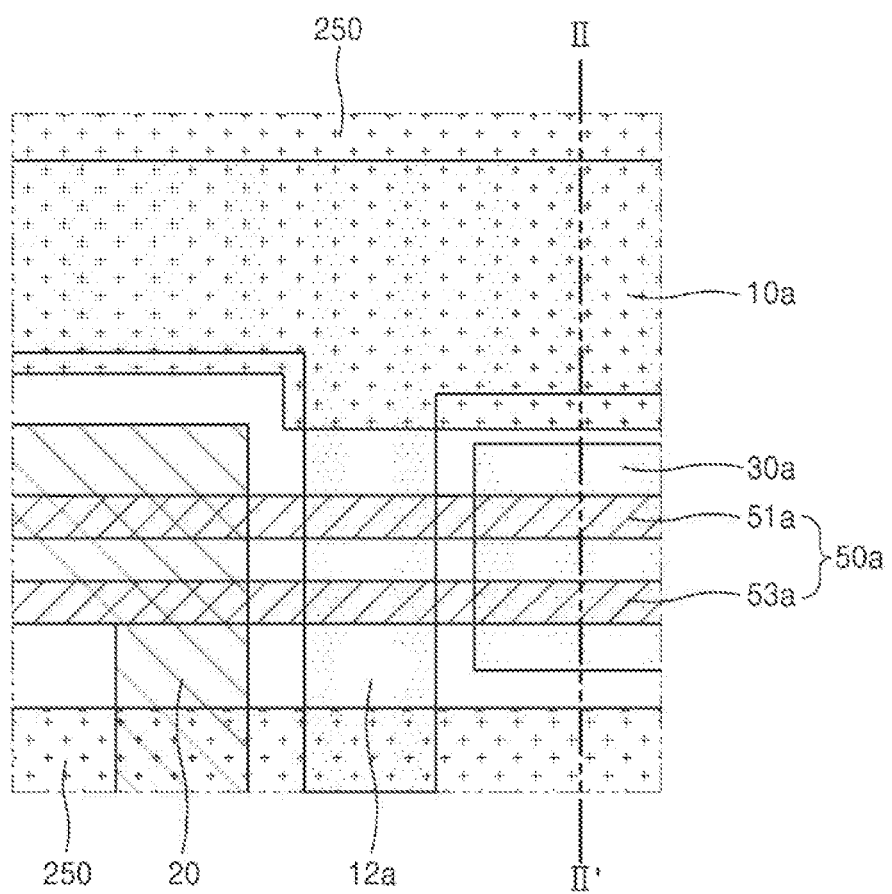
FIG. 2 is a schematic enlarged plan view of a region A of FIG. 1.
Figure 3:
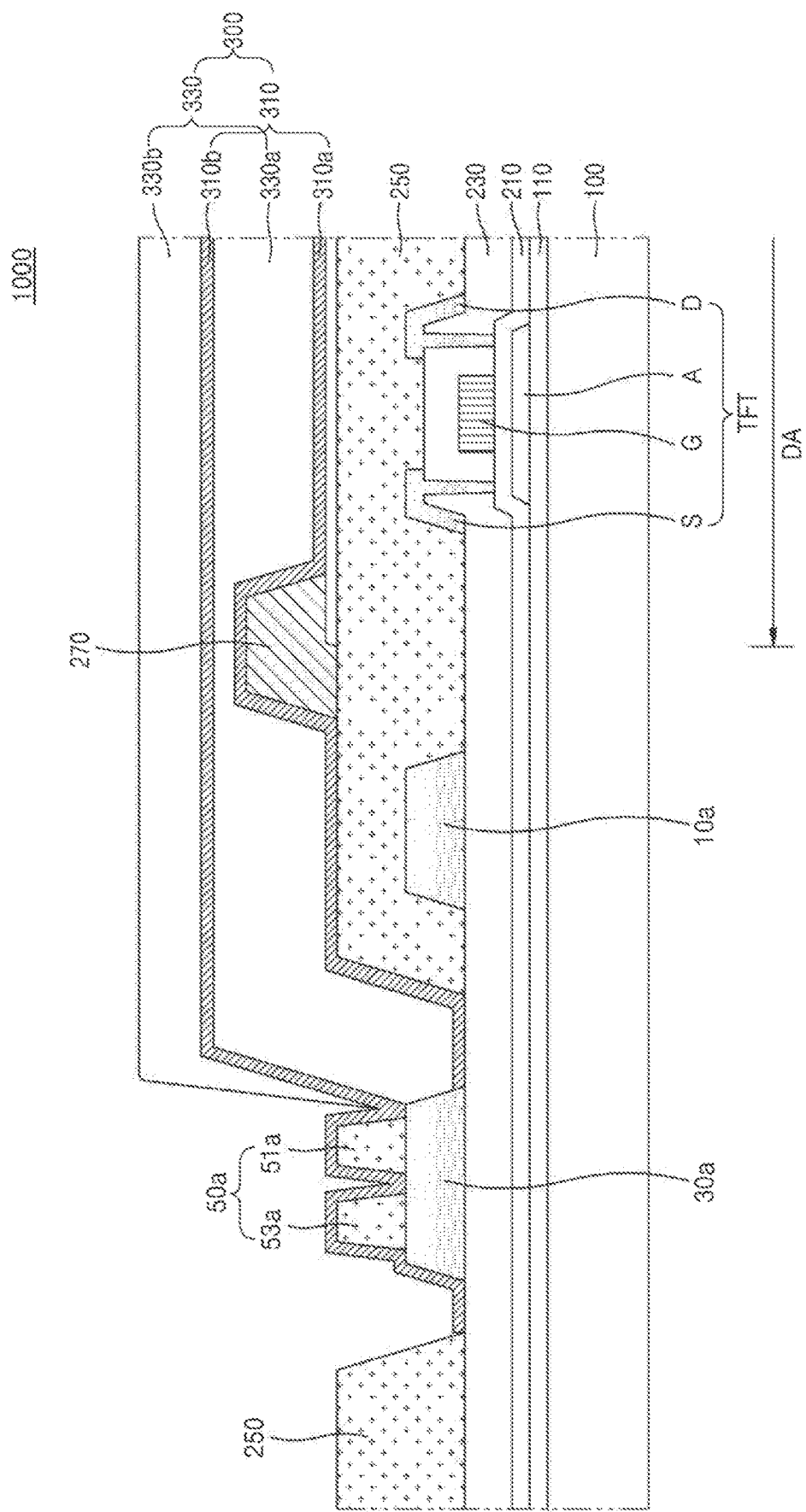
FIG. 3 is a schematic cross-sectional view taken along line II-II' of FIG. 2.
Figure 4:
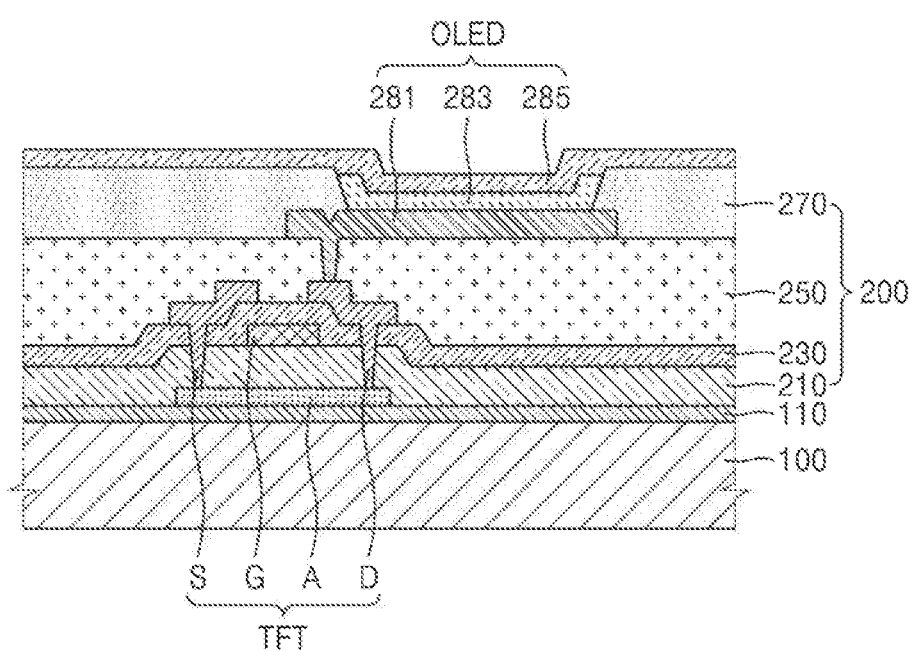
FIG. 4 is a cross-sectional view of a display unit according to an exemplary embodiment.

FIG. 1 is a schematic plan view of an OLED display 1000 according to an exemplary embodiment. FIG. 2 is a schematic enlarged plan view of a region A of FIG. 1. FIG. 3 is a schematic cross-sectional view taken along line II-II' of FIG. 2. FIG. 4 is a cross-sectional view of a display unit according to an exemplary embodiment.

Referring to FIGS. 1 through 4, the OLED display 1000 according to an exemplary embodiment includes a substrate 100, a display unit 200 on the substrate 100, a thin-film encapsulation layer 300 for sealing the display unit 200, voltage lines 10a and 20 formed in a non-display area and surrounding a display area DA, and a dam unit (or dam) 50a having at least a part contacting the voltage lines 10a and 20.

The substrate 100 may include various materials. According to an exemplary embodiment, the substrate 100 includes a $SiO_2$-based transparent glass material but is not limited thereto. The substrate 100 may include a transparent plastic material. The plastic material may be an organic material selected from the group consisting of polyethersulphone (PES), polyacrylate (PAR), polyetherimide (PEI), polyethylene napthalate (PEN), polyethyleneterepthalate (PET), polyphenylene sulfide (PPS), polyallylate, polyimide, polycarbonate (PC), cellulose triacetate (TAC), and cellulose acetate propionate (CAP), which are insulating organic materials.

When the OLED display 1000 is a bottom emission-type display device in which an image is formed in a direction of the substrate 100, the substrate 100 should be formed of a transparent material. However, when the OLED display 1000 is a top emission-type display device in which an image is formed in a direction away from the substrate 100, the substrate 100 does not need to include a transparent material. In this case, the substrate 100 may be formed of a metal. When the substrate 100 includes a metal, the substrate 100 may include, but is not limited to, at least one of iron, chromium, manganese, nickel, titanium, molybdenum, stainless steel (SUS), Invar alloy, Inconel alloy, and Kovar alloy.

The display unit 200 may be formed on the substrate 100. The display unit 200 may include the display area DA in which an image is formed and viewed by a user, and the non-display area, which is the perimeter of the display area DA.

An OLED may be disposed in the display area DA, and the voltage lines 10a and 20 may be disposed in the non-display region and supply power to the OLED.

In the non-display area, a pad unit PAD may be further included and transmit an electric signal to the display area DA from a power supply (not shown) or a signal generator (not shown).

The pad unit PAD may include a driver IC 410, a pad 430 that connects the driver IC 410 to a pixel circuit, and a fan out line 420.

The driver IC 410 may include a data driving unit (or data driver) for supplying a data signal to the pixel circuit and various function units for driving the pixel circuit. The driver IC 410 may be mounted on the substrate 100 as a chip on glass (COG) type. A connection terminal (not shown) that is electrically connected to the pad 430 formed on the substrate 100 may be provided to one side of the driver IC 410. An adhesive material including a conductive ball and capable of electrical connection may be disposed between the pad 430 and the connection terminal (not shown) to bond the pad 430 and the connection terminal (not shown). Examples of the adhesive material may include an anisotropic conductive film, a self-organized conductive film, etc.

The pad 430 may be a part formed on the substrate 100 and electrically connected to the connection terminal of the driver IC 410. The pad 430 may be electrically connected to the fan out line 420. As shown in FIG. 1, the pad 430 may include a different layer from that of the fan out line 420 but is not limited thereto. The pad 430 may elongate from the fan out line 420 and be disposed on the same layer as the fan out line 420. The pad 430 may include a layer or multilayers including at least one material selected from molybdenum (Mo), aluminum (Al), copper (Cu), silver (Ag), and titanium (Ti).

The fan out line 420 may connect the pad 430 to the pixel circuit. The fan out line 420 may be formed of the same material and formed on the same layer as that of a gate electrode G. That is, the fan out line 420 may be disposed on a gate insulation layer 210.

The display unit 200 will be described in more detail with reference to FIG. 4 below.

A buffer layer 110 may be formed on the substrate 100. The buffer layer 110 may provide a flat surface on the substrate 100 and prevent impurities or moisture from permeating the substrate 100. For example, the buffer layer 110 is formed of inorganic materials such as silicon oxide, silicon nitride, silicon oxynitride, aluminum oxide, aluminum nitride, titanium oxide, titanium nitride, etc., organic materials such as polyimide, polyester, acryl, etc., or a stack structure including a plurality of materials among the above materials. The buffer layer 110 may be formed on the display area DA and extend to the non-display area.

The display area DA may have, for example, a rectangular shape. A thin-film transistor TFT and the OLED electrically connected to the thin-film transistor TFT may be disposed in the display area DA.

The thin-film transistor TFT may include an active layer A, the gate electrode G, a source electrode S, and a drain electrode D.

The thin-film transistor TFT is a top gate-type transistor in which the active layer A, the gate electrode G, the source electrode S, and the drain electrode D are sequentially formed in this order. However, the exemplary embodiment is not limited thereto and other various types of thin-film transistors such as a bottom gate-type transistor may be employed as the thin-film transistor TFT.

The active layer A may be formed of polysilicon and may include a channel area that is not doped with impurities and a source area and a drain area that are doped with impurities on both sides of the channel area. In this regard, impurities may be different depending on a type of the thin-film transistor TFT and may be N type impurities or P type impurities.

After the active layer A is formed, the gate insulation layer 210 may be formed on the active layer A over the entire surface of the substrate 100. The gate insulation layer 210 may include a multi-layer structure or a single layer formed of an inorganic material such as a silicon oxide or a silicon nitride. The gate insulation layer 210 may insulate the active layer A from the gate electrode G disposed on the active layer A. The gate insulation layer 210 may extend to not only the display area DA but also to a part of the non-display area.

After the gate insulation layer 210 is formed, the gate electrode G may be formed on the gate insulation layer 210. The gate electrode G may be formed using a photolithography process and an etching process.

The gate electrode G may be formed on the gate insulation layer 210. The gate electrode G may be connected to a gate line (not shown) that applies an on/off signal to the thin film transistor TFT.

The gate electrode G may include a low resistance metal material. The gate electrode G may include a single layer or multiple layers using, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), by taking into account the adhesive strength between the gate electrode G and a layer adjacent thereto, the surface flatness and processability of stacked layers, etc.

After the gate electrode G is formed, an interlayer insulation layer 230 may be formed over the entire surface of the substrate 100. The interlayer insulation layer 230 may insulate between the source electrode S and the drain electrode D and the gate electrode G. The interlayer insulation layer 230 may extend to not only the display area DA but also a part of the non-display area.

The interlayer insulation layer 230 may be formed of an inorganic material. According to an exemplary embodiment, the interlayer insulation layer 230 is formed of a metal oxide or a metal nitride. Examples of the organic material may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), and a zinc oxide ($ZrO_2$).

The interlayer insulation layer 230 may include a multi-layer structure or a single layer formed of an inorganic material such as silicon oxide (SiOx) and/or silicon nitride (SiNx). In some exemplary embodiments, the interlayer insulation layer 230 may have a double layer structure of SiOx/SiNy or SiNx/SiOy.

The source electrode S and the drain electrode D of the thin film transistor TFT may be disposed on the interlayer insulation layer 230. The source electrode S and the drain electrode D may each include a single layer or multiple layers including, for example, at least one of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu). The source electrode S and the drain electrode D may be formed to contact an area of the active layer A.

A planarization layer 250 may be formed over the entire surface of the substrate 100 and cover the source electrode S and the drain electrode D. The planarization layer 250 may remove a step formed by the thin film transistor TFT and planarize an upper surface of the substrate 100 and prevent malfunction of the OLED due to a lower uneven structure.

The planarization layer 250 may be formed of an insulation material. For example, the planarization layer 250 is formed of an inorganic material, an organic material, or an organic/inorganic composite material and has a single layer or a multi-layer structure by using various deposition methods. In some exemplary embodiments, the planarization layer 250 is formed of at least one material from among an acrylic resin (polyacrylates resin), an epoxy resin, a phenolic resin, a polyamide resin, a polyimide resin, an unsaturated polyester resin, a polyphenylene ether resin, a polyphenylene sulfide resin, and a benzocyclobutene (BCB).

The OLED may be provided on the planarization layer 250. The OLED may include a pixel electrode 281, an intermediate layer 283 including an organic emissive layer, and an opposite electrode 285. As shown in FIG. 4, the pixel electrode 281 may be electrically connected to the drain electrode D.

The pixel electrode 281 and/or the opposite electrode 285 may include a transparent electrode or a reflective electrode. When the pixel electrode 281 and/or the opposite electrode 285 include a transparent electrode, the transparent electrode may include ITO, IZO, ZnO, or $In_2O_3$. When the pixel electrode 281 and/or the opposite electrode 285 include a reflective electrode, the reflective electrode may include a reflective layer including Ag, Mg, Al, Pt, Pd, Au, Ni, Nd, Ir, Cr or a compound thereof and a transparent layer including ITO, IZO, ZnO, or $In_2O_3$. In some exemplary embodiments, the pixel electrode 281 or the opposite electrode 285 may have an ITO/Ag/ITO structure.

The pixel electrode 281 may be formed on the planarization layer 250 and electrically connected to the thin film transistor TFT via a contact hole formed in the planarization layer 250. For example, the pixel electrode 281 is a reflective electrode. For example, the pixel electrode 281 includes a reflective film formed of Ag, Mg, Al, Pt, Pd, Au, Ni, Nd, Ir, Cr, or a combination thereof, and a transparent or semi-transparent electrode layer formed on the reflective film. The transparent or semi-transparent electrode layer may include at least one of indium tin oxide (ITO), indium zinc oxide (IZO), zinc oxide (ZnO), indium oxide (In$_2$O$_3$), indium gallium oxide (IGO), and aluminum zinc oxide (AZO).

The opposite electrode 285 disposed opposite the pixel electrode 281 may be a transparent or semi-transparent electrode, and may include a metal thin film with a low work function such as Li, Ca, LiF/Ca, LiF/Al, Al, Ag, Mg, or a combination thereof. An auxiliary electrode layer or a bus electrode may be further formed on the metal thin film by using a material for forming a transparent electrode, e.g., ITO, IZO, ZnO, In$_2$O$_3$, or the like. Thus, the opposite electrode 285 may allow light emitted from the organic emission layer included in the intermediate layer 283 to pass therethrough. That is, the light emitted from the organic emission layer may be reflected directly or via the pixel electrode 281, which is a reflective electrode, and emitted toward the opposite electrode 285.

However, the display unit 200 according to the present embodiment is not limited to a top emission-type display device and may be a bottom emission-type display device in which light emitted from the organic emission layer is emitted toward the substrate 100. In this case, the pixel electrode 281 may be a transparent or semi-transparent electrode and the opposite electrode 285 may be a reflective electrode. Also, the display unit 200 according to the present embodiment may be a dual emission-type display device in which light is emitted in both directions of front and bottom surfaces thereof.

A pixel-defining film 270 formed of an insulating material may be disposed on the opposite electrode 285. The pixel-defining film 270 may include at least one organic insulating material selected from the group consisting of polyimide, polyamide, acryl resin, benzocyclobutene, and phenol resin by spin coating or the like.

The pixel-defining film 270 may function to define a pixel area and a non-pixel area. The pixel-defining film 270 may be formed on the substrate 100 and include an opening partially exposing the pixel electrode 281. As shown in FIG. 3, the thin film encapsulation layer 300 may seal the display unit 200 and prevent external oxygen and moisture from permeating into the display unit 200. The thin film encapsulation layer 300 may include a plurality of organic layers 330 and a plurality of inorganic layers 310. The organic layers 330 and the inorganic layers 310 may be alternately stacked to form a multilayer structure. An example of the thin film encapsulation layer 300 including two organic layers 330a and 330b and two inorganic layers 310a and 310b is illustrated in FIG. 3 but the exemplary embodiments are not limited thereto.

The organic layers 330a and 330b may each include, for example, at least one of acryl-based resin, methacryl-based resin, polyisoprene, vinyl-based resin, epoxy-based resin, urethane-based resin, cellulose-based resin, and perylene-based resin.

The inorganic layers 310a and 310b may each include, for example, at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

As shown in FIG. 1, the voltage lines 10a and 20 surrounding the display area DA and the dam unit 50a may be disposed in the non-display area outside the display area DA.

The voltage lines 10a and 20 may be formed of the same materials as those of the source electrode S and the drain electrode D. The voltage lines 10a and 20 may include the first voltage line 10a and the second voltage line 20. According to an exemplary embodiment, the first voltage line 10a is a driving voltage line ELVDD, and the second voltage line 20 may be a common voltage line ELVSS. The second voltage line 20 may be connected to the opposite electrode 285.

The first voltage line 10a may be disposed to correspond to at least one side of the display area DA. The first voltage line 10a may include a pair of first end portions 11 formed in parallel to one side of the display area DA. In this regard, the at least one side corresponding to the first voltage line 10a may be a side adjacent to the pad unit PAD.

The second voltage line 20 may surround the pair of first end portions 11 of the first voltage line 10a and the other sides of the display area DA.

The second voltage line 20 may include a pair of second end portions 21 bent to cover outer sides of the pair of first end portions 11. Each of the first end portions 11 may be disposed between the display area DA and the pair of second end portions 21.

The first voltage line 10a may include a pair of first connection units (or connectors) 12a. The second voltage line 20 may include a pair of second connection units 22. The pair of first connection units 12a may extend in a direction perpendicular to (or crossing) the pair of first end portions 11. The pair of second connection units 22 may be formed in parallel to the pair of first connection units 12a from the pair of second end portions 21.

The pair of first connection units 12a and the pair of second connection units 22 may be connected to the pad unit PAD outside the at least one side of the display area DA.

At least a part of the dam unit 50a may be formed to contact the first voltage line 10a and/or the second voltage line 20.

The dam unit 50a may surround and be integrally connected around four sides of the display area DA outside the display area DA. That is, the dam unit 50a may continuously surround the four sides of the display area DA in a ring shape.

The dam unit 50a may prevent flow of an organic material along an edge of the substrate 100 when the organic layers 330 of the thin film encapsulation layer 300 for sealing the display unit 100 are formed, thereby preventing formation of edge tails of the organic layers 330.

As shown in FIG. 3, the organic layers 330 of the thin film encapsulation layer 300 may be formed larger than the inorganic layers 310. In this regard, the dam unit 50a may prevent flow of the organic material along the edge of the substrate 100 when the organic layers 330 are formed. The organic layers 330 may be disposed inside the dam unit 50a.

According to an exemplary embodiment, the inorganic layers 310 extend and contact each other outside the dam unit 50a. At least one of the inorganic layers 310 may contact the gate insulation layer 210 or the interlayer insulation layer 230 outside the dam unit 50a, thereby preventing permeation of external moisture into a side surface of the thin film encapsulation layer 300 and improving the adhesive strength of the thin film encapsulation layer 300.

According to an exemplary embodiment, outside the dam unit 50, at least one of the inorganic layers 310 contacts a top surface of the substrate 100 by passing by an end portion of the interlayer insulation layer 230 and may contact side surfaces of the gate insulation layer 210 and the interlayer insulation layer 230. Thus, edges of the inorganic layers 310 may be separated, thereby preventing the weakening and removal of an encapsulation characteristic of the thin film encapsulation layer 300.

The dam unit 50a of the OLED display 1000 according to the present embodiment may include at least two or more dams.

According to an exemplary embodiment, as shown in FIGS. 1 through 3, the dam unit 50a includes a first dam 51a and a second dam 53a spaced apart from the first dam 51a by a predetermined distance and formed outside the first dam 51a.

The dam unit 50a may include at least two dams, thereby effectively blocking reflow of an organic material and preventing flow of an organic layer when only one dam is provided.

Although FIGS. 1 through 3 illustrate embodiments in which the dam unit 50a includes the first dam 51a and the second dam 53a, the number of dams is not limited thereto as long as at least two are provided.

Although the first dam 51a and the second dam 53a have the same height in the embodiments of FIGS. 1 through 3, when two or more dams are formed, the height of the dam unit 50a may increase toward the outside of the substrate 10.

The organic layers 330 of the thin film encapsulation layer 300 of the OLED display 1000 according to the present embodiment may block an organic material from spreading and overflowing due to the dam unit 50a when the organic layers 330 are formed inside the first dam 51a located innermost on the substrate 100.

That is, the dam unit 50a may provide a double dam including the first dam 51a and the second dam 53a, thereby blocking an organic layer from spreading and overflowing due to the first dam 51a, and thus, no organic layers may be formed between the first dam 51a and the second dam 53a.

No organic layers may be formed between the first dam 51a and the second dam 53a, thereby efficiently preventing permeation of external moisture.

The dam unit 50a may include an organic material. According to an exemplary embodiment, the dam unit 50a may include at least one organic insulating material selected from the group consisting of polyimide, polyamide, acryl resin, benzocyclobutene, and phenol resin.

A metal layer 30a may be formed between the pair of first connection units 12a of the first voltage line 10a. As shown in FIG. 3, the metal layer 30a may be located below the dam unit 50a to contact the dam unit 50a.

The metal layer 30a may thus improve the adhesive strength of the dam unit 50 formed between the pair of first connection unit 12a.

When the dam unit 50a includes an organic material, the adhesive strength of the organic material of the dam unit 50a with respect to an inorganic material is weak. Thus, when the dam unit 50a adheres to the inorganic material, a separation phenomenon may occur, and external moisture or oxygen may permeate, and thus the OLED may be damaged.

In the OLED display 1000 according to the present embodiment, the dam unit 50a may be integrally connected and continuously surround four sides of the display area DA, and the metal layer 30a may contact a lower portion of the dam unit 50a between the pair of first connection units 12, and thus the adhesive strength of the dam unit 50a may be improved.

An area in which the metal layer 30a is formed is not limited. Thus, as long as at least a part of the metal layer 30a is below the dam unit 50, the metal layer may be formed between the pair of first connection units 12a without limitation.

According to an exemplary embodiment, the metal layer 30a may be formed with the first voltage line 10a. Thus, the metal layer 30a may be formed on the same layer and may be formed of the same material as the first voltage line 10a.

According to an exemplary embodiment, the metal layer 30a may be formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As another selective embodiment, the metal layer 30a is formed with the source electrode S and the drain electrode D of the thin film transistor TFT. Thus, the metal layer 30a may be formed on the same layer and may include the same material as the source electrode S and the drain electrode D.

As shown in FIG. 3, the dam unit 50a is formed on the same layer and formed of the same material as the planarization layer 250.

The metal layer 30a may be formed below the dam unit 50a and thus the lower portion of the dam unit 50a may contact the metal layer 30a. The dam unit 50a may be formed above the metal layer 30a and have substantially the same height as that of the planarization layer 250. However, the height of the dam unit 50 is not limited thereto.

According to an exemplary embodiment, the dam unit 50a is formed of an organic insulating material including at least one material from among an acrylic resin (polyacrylates resin), an epoxy resin, a phenolic resin, a polyamide resin, a polyimide resin, an unsaturated polyester resin, a polyphenylene ether resin, a polyphenylene sulfide resin, and a benzocyclobutene (BCB).

As shown in FIG. 1, the dam unit 50a of the OLED display 1000 according to the present embodiment may be formed to contact the second voltage line 20 on at least three sides of the display area DA.

That is, the second dam 53a formed outermost in the dam unit 50a may be formed to contact an edge of the second voltage line 20 on at least three sides of the display area DA.

On one side of the display area DA corresponding to a side in which the first end portions 11 of the first voltage line 10a are disposed, the dam unit 50a surrounding the display area DA may be integrally and continuously connected and may have at least a part contacting the second end portions 21. In other parts of the dam unit 50a, at least a part of the dam unit 50a may contact the first connection units 12. In the other parts of the dam unit 50a, at least a part of the dam unit 50a may contact the metal layer 30a.

Therefore, at least three sides of the dam unit 50a including four sides in the ring shape may contact the second voltage line 20, and the one side thereof may contact the second end portions 21, the first connection units 12a, and the metal layer 30a, thereby improving the adhesive strength of the dam unit 50a.

Figure 5:
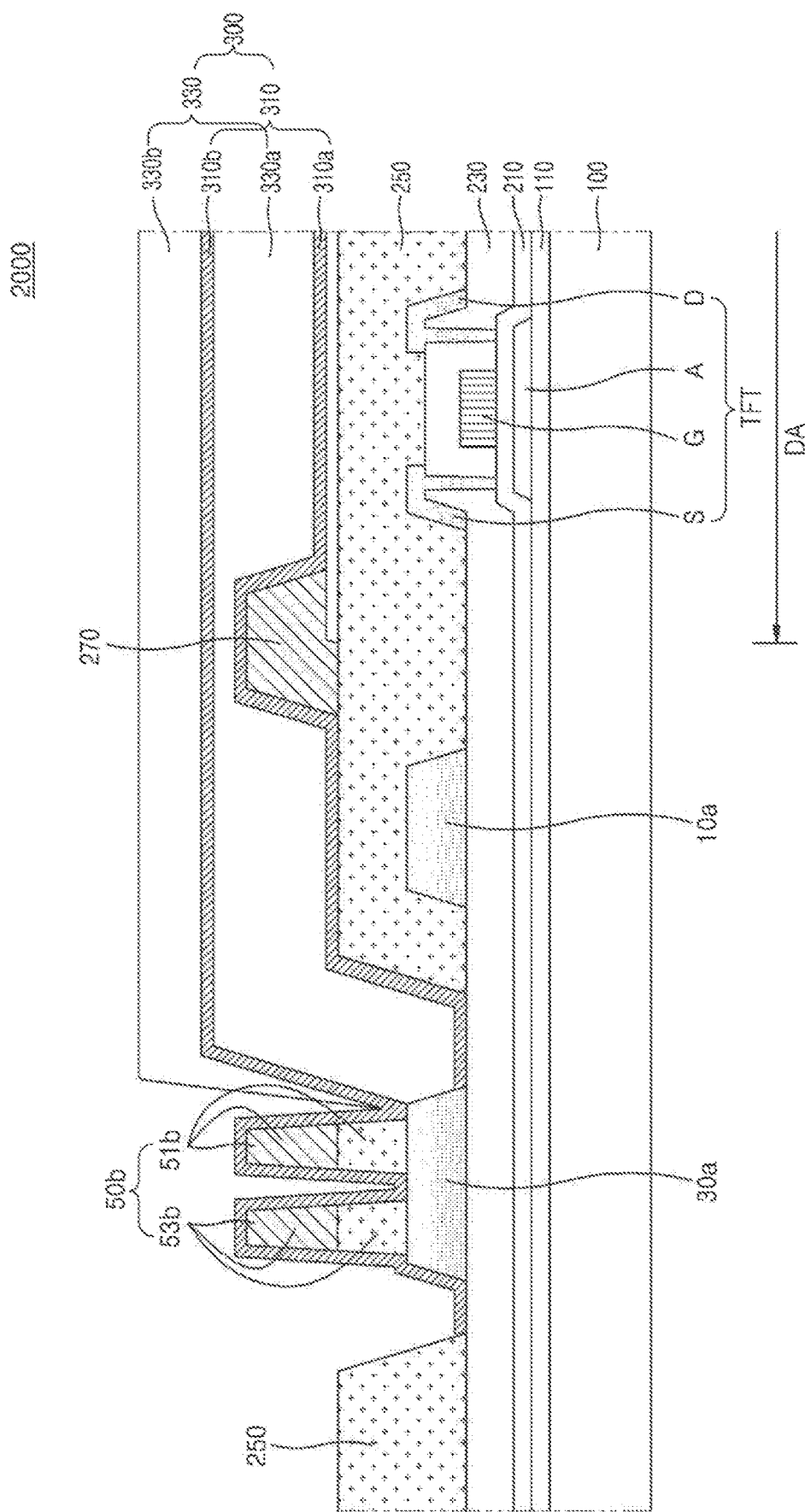
FIG. 5 is a cross-sectional view of an OLED display according to another exemplary embodiment.

FIG. 5 is a cross-sectional view of an OLED display 2000 according to another exemplary embodiment. The same reference numerals between FIGS. 1 through 4 and 5 denote the same elements, and thus redundant descriptions thereof are omitted for brevity of explanation.

A dam unit 50b of the OLED display 2000 according to the present embodiment may have the same function as that of the dam unit 50a of the OLED display 1000 shown in FIGS. 1 through 3, and thus the differences therebetween will now be described.

The dam unit 50b may include at least two dams, and may be integrally connected and surround four sides of the display area DA outside the display area DA. That is, the dam unit 50b may continuously surround the four sides of the display area DA in a ring shape.

The dam unit 50b may contact the metal layer 30a between the pair of first connection units 12 (see FIG. 1), and thus the adhesive strength of the dam unit 50b may be improved, thereby reducing a probability that external moisture or oxygen may permeate and improving the reliability of the OLED.

According to an exemplary embodiment, the dam unit 50b includes a part formed on the same layer as the planarization layer 250 and a part formed on the same layer as the pixel-defining layer 270.

That is, when the planarization layer 250 is formed, the part of the dam unit 50b may be formed on the same layer as the planarization layer 250, and, when the pixel-defining layer 270 is formed, the part of the dam unit 50b may be formed on the same layer as the pixel-defining layer 270.

The part of the dam unit 50b formed on the same layer as the pixel-defining layer 270 may be formed of the same material as that of the pixel-defining layer 270. According to an exemplary embodiment, the part of the dam unit 50b is formed of at least one organic insulating material selected from the group consisting of polyimide, polyamide, acryl resin, and benzocyclobutene.

The part of the dam unit 50b formed on the same layer as the planarization layer 250 and the part of the dam unit 50b formed on the same layer as the pixel-defining layer 270 may be integrally formed.

The organic layer 330 may be blocked from spreading and overflowing by a first dam 51b, and thus the organic layer 330 may not be formed between the first dam 51b and a second dam 53b.

No organic layers may be formed between the first dam 51b and the second dam 53b, and the organic layer 330 may be formed inside the first dam 51b, thereby efficiently preventing permeation of external moisture.

As shown in FIG. 5, the dam unit 50b may be formed above the metal layer 30a and have the same height as those of the planarization layer 250 and the pixel-defining layer 270. However, the height of the dam unit 50b is not limited thereto.

According to an exemplary embodiment, the first dam 51b and the second dam 53b are formed to have different heights. That is, a height of the second dam 53b located outside the substrate 100 may be relatively higher than that of the first dam 51b.

Figure 6:
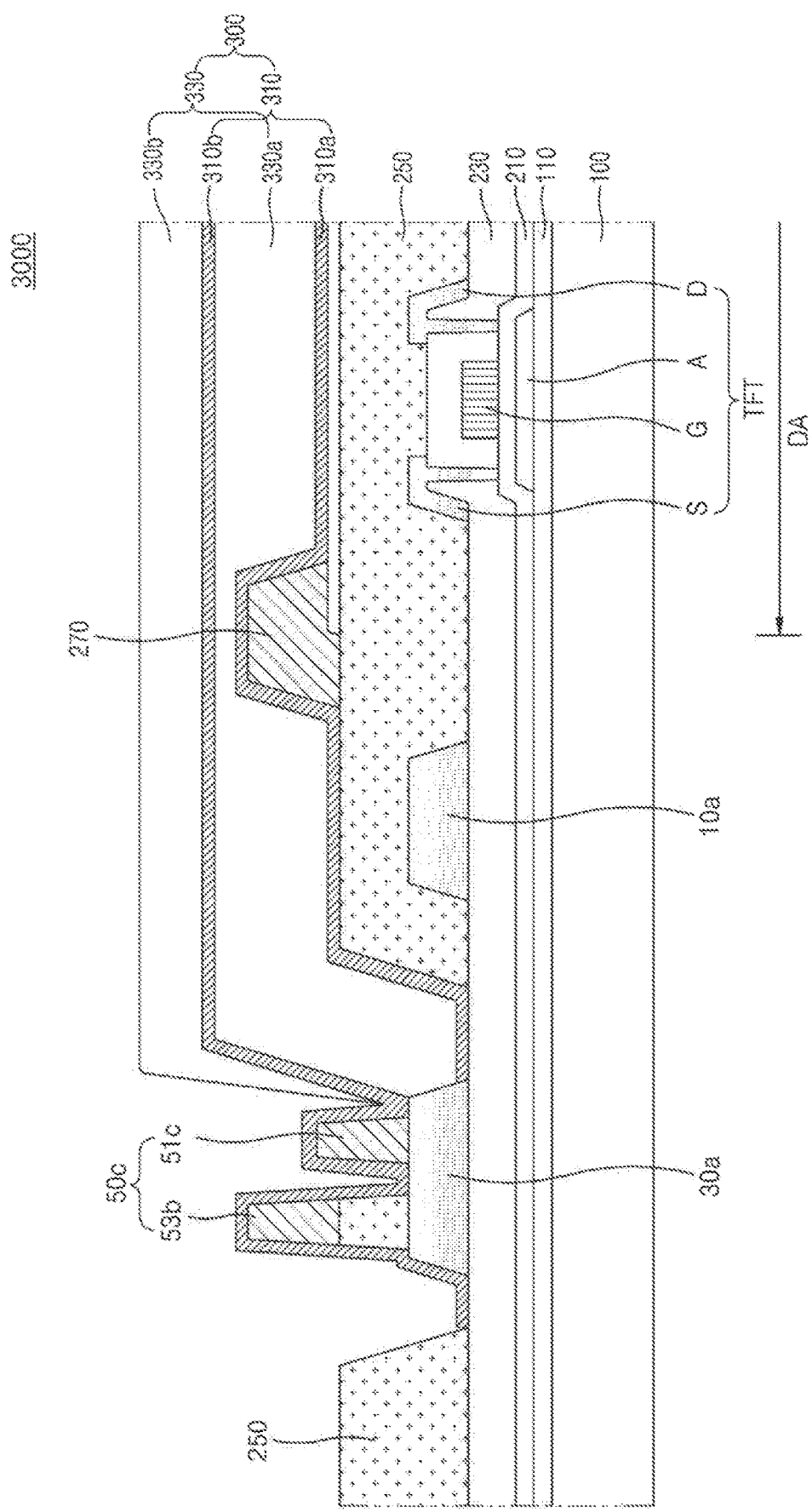
FIG. 6 is a cross-sectional view of an OLED display according to another exemplary embodiment.

FIG. 6 is a cross-sectional view of an OLED display 3000 according to another exemplary embodiment. The same reference numerals between FIGS. 1 through 4 and 6 denote the same elements, and thus redundant descriptions thereof are omitted for brevity of explanation.

A dam unit 50c of the OLED display 3000 according to the present embodiment may have the same function as that of the dam units 50a and 50b described above, and thus the differences therebetween will now be described for convenience of description.

The dam unit 50c of the OLED display 3000 according to the present embodiment may include a first dam 51c and the second dam 53b having different heights. That is, a height of the second dam 53b may be higher than that of the first dam 51c.

In this case, the first dam 51c may include the same material as the pixel-defining layer 270 when the pixel-defining layer 270 is formed, and a lower portion of the second dam 53b may include the same material as that of the planarization layer 250 when the planarization layer 250 is formed, and then, when the pixel-defining layer 270 is formed, an upper portion of the second dam 53b may include the same material as that of the pixel-defining layer 270 with the first dam 51c.

That is, the dam unit 50c may include the same material as that of the planarization layer 250 and/or the pixel-defining layer 270 when the planarization layer 250 and/or the pixel-defining layer 270 is formed. In this case, the height and the material of the dam unit 50c are not limited.

According to an exemplary embodiment, a part of the second dam 53b formed on the same layer as the planarization layer 250 and a part thereof formed on the same layer as the pixel-defining layer 270 may include the same material so that lower and upper portions of the second dam 53b may be integrally formed.

No organic layers may be formed between the first dam 51c and the second dam 53b, and the organic layer 330 may be formed inside the first dam 51c, thereby efficiently preventing permeation of external moisture.

Figure 7:
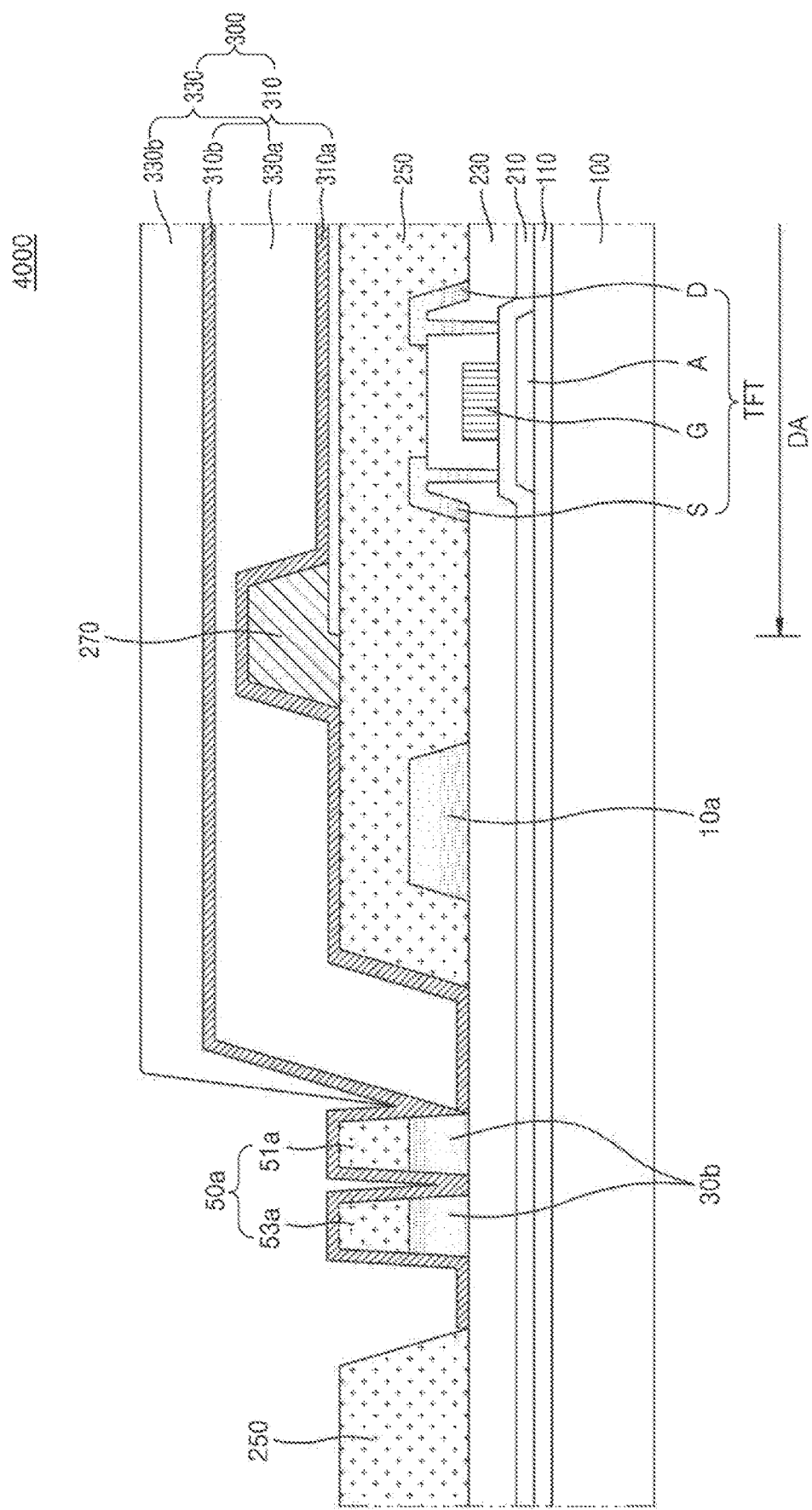
FIG. 7 is a cross-sectional view of an OLED display according to another exemplary embodiment.

FIG. 7 is a cross-sectional view of an OLED display 4000 according to another exemplary embodiment. The same reference numerals between FIGS. 1 through 4 and 7 denote the same elements, and thus redundant descriptions thereof are omitted for brevity of explanation.

A metal layer 30b of the OLED display 4000 according to the present embodiment may be formed only in a lower portion of the dam unit 50a. That is, the metal layer 30b may be completely located in the lower portion of the dam unit 50 to contact the dam unit 50a.

According to the present embodiment, the metal layer 30b may be formed between an inorganic layer such as the gate insulating layer 210, the interlayer insulating layer 230, etc. and the dam unit 50a, thereby improving the adhesive strength of the dam unit 50a and effectively blocking permeation of external moisture or oxygen to improve the reliability of the OLED.

According to an exemplary embodiment, the metal layer 30b may be formed on the same layer and include the same material as that of the source electrode S and the drain electrode D of the thin film transistor TFT.

The dam unit 50a may include the first dam 51a and the second dam 53a and may be formed on the same layer and include the same material as that of the planarization layer 250.

As shown in FIG. 7, the dam unit 50a has substantially the same height as that of the planarization layer 250 but the height of the dam unit 50a is not limited thereto. According to an exemplary embodiment, the height of the second dam 53a may be greater than that of the first dam 51a outside the substrate 100.

Figure 8:
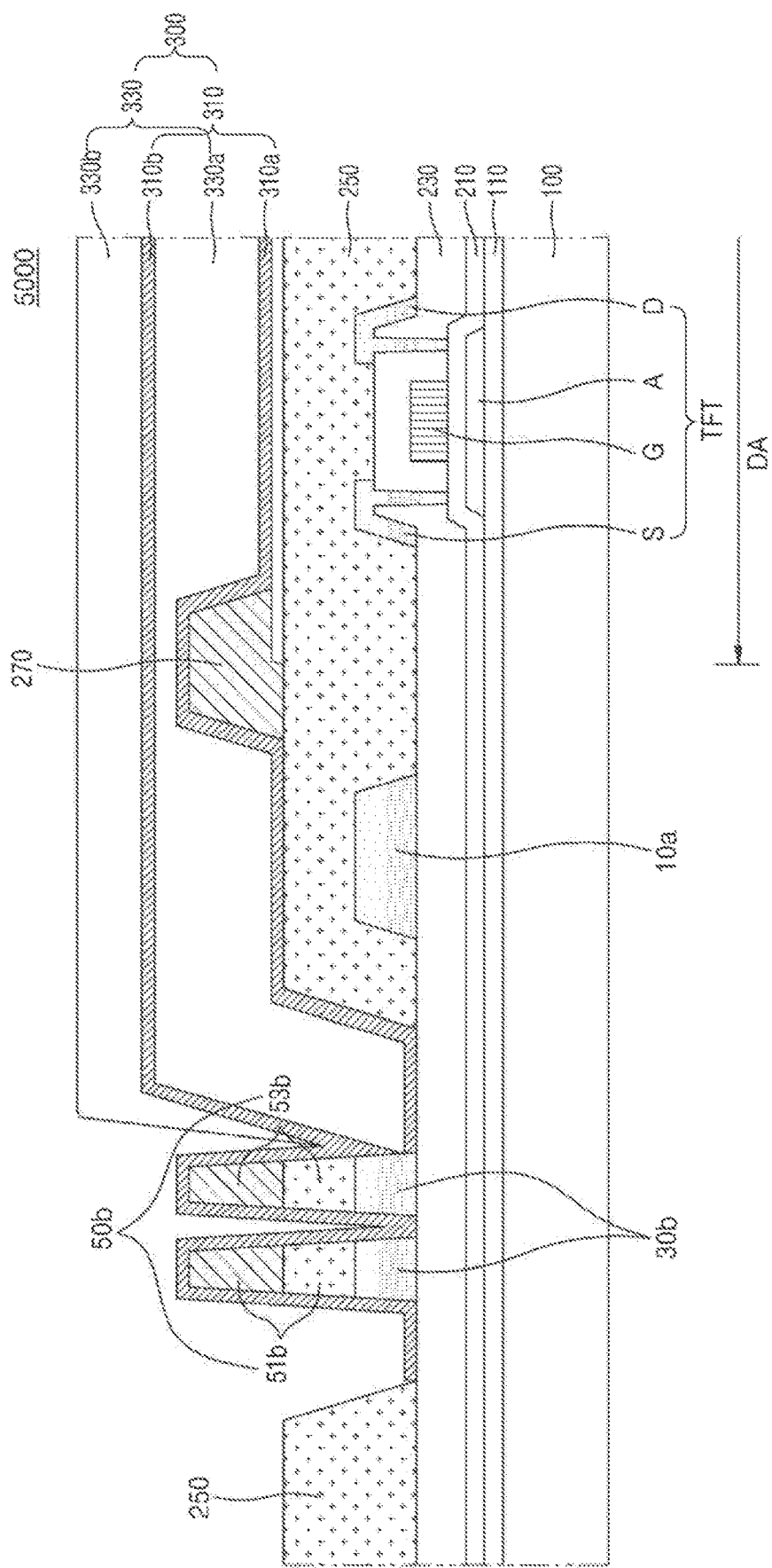
FIG. 8 is a cross-sectional view of an OLED display according to another exemplary embodiment.

FIG. 8 is a cross-sectional view of an OLED display 5000 according to another exemplary embodiment. The same reference numerals between FIGS. 1 through 5 and 8 denote the same elements, and thus redundant descriptions thereof are omitted for brevity of explanation.

In the OLED display 5000 according to the present exemplary embodiment, the metal layer 30b is completely located in a lower portion of the dam unit 50b and contacts the dam unit 50b. That is, the metal layer 30b may be formed only in an area in which the dam unit 50b is formed.

The metal layer 30b may be formed in a lower portion of the area in which the dam unit 50b is formed, thereby improving the adhesive strength of the dam unit 50b and effectively blocking permeation of external moisture or oxygen to improve the reliability of the OLED.

According to an exemplary embodiment, the metal layer 30b is formed on the same layer and formed of the same material as that of the first voltage line 10a.

As another selective embodiment, the metal layer 30b is formed on the same layer and formed of the same material as that of the source electrode S and the drain electrode D of the thin film transistor TFT.

The dam unit 50a may include the first dam 51b and the second dam 53b and, according to an exemplary embodiment, may include a part formed on the same layer as the planarization layer 250 and a part formed on the same layer as the pixel-defining layer 270.

As shown in FIG. 8, the first dam 51b and the second dam 53b may have the same height but a height of the dam unit 51b is not limited thereto. The height of the second dam 53b located outside of the substrate 100 may be relatively higher than that of the first dam 51b.

According to an exemplary embodiment, when the planarization layer 250 is formed, a lower portion of the dam unit 53b may be formed with the planarization layer 250, and then, when the pixel-defining layer 270 is formed, the first dam 51b and an upper portion of the second dam 53b may be formed with the pixel-defining layer 270.

According to an exemplary embodiment, the part of the dam unit 51b formed on the same layer as the planarization layer 250 and the part of the dam unit 51b formed on the same layer as the pixel-defining layer 270 are formed of the same material and integrally formed.

Figure 9:
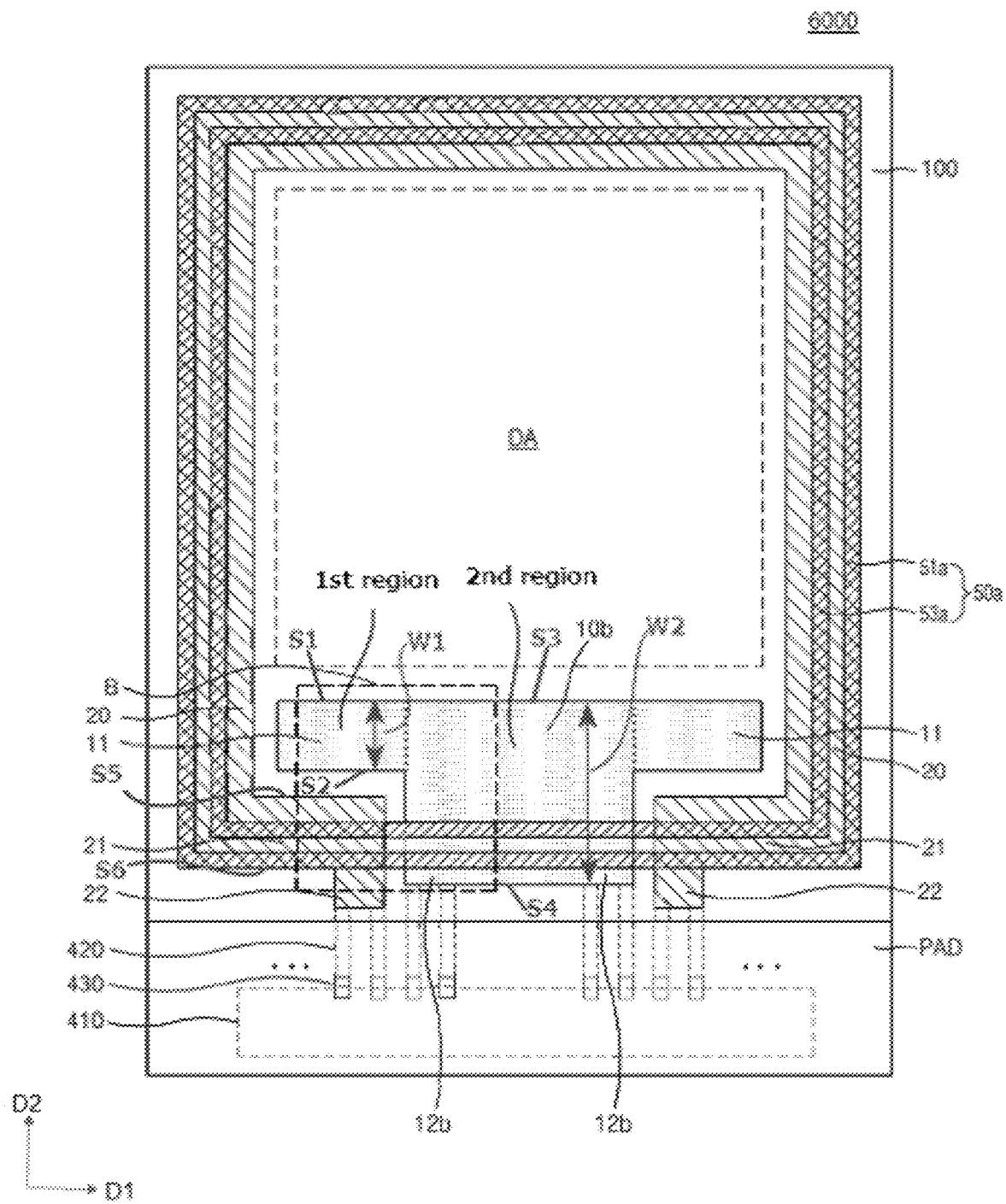
FIG. 9 is a schematic plan view of an OLED display according to another exemplary embodiment.
Figure 10:
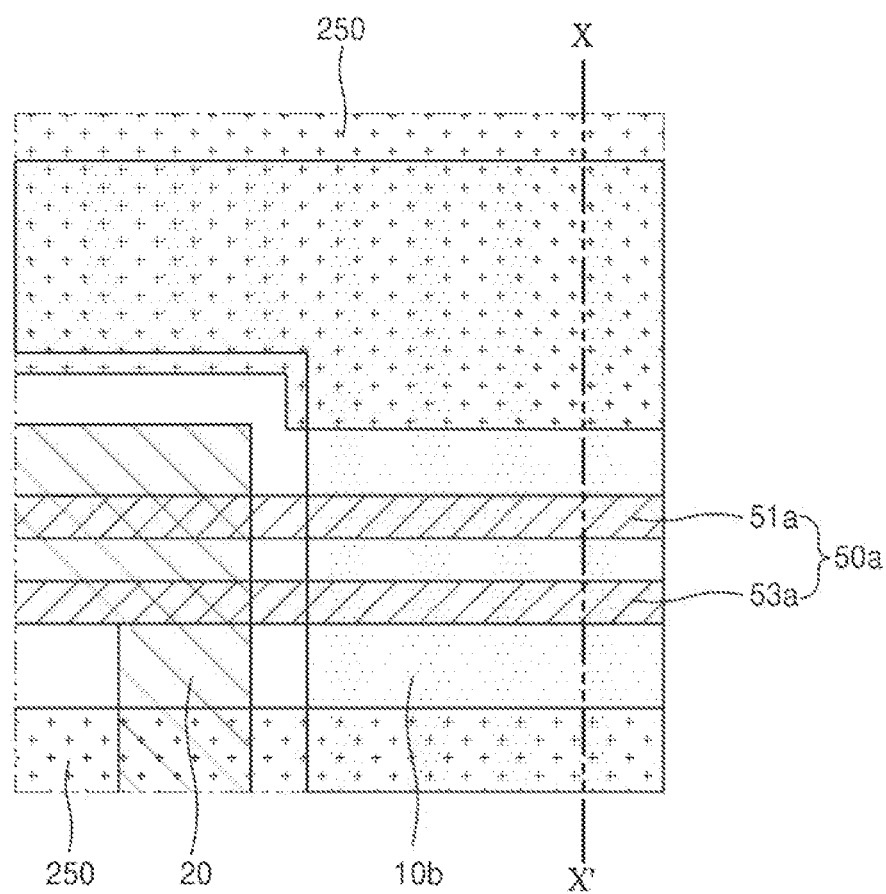
FIG. 10 is a schematic enlarged plan view of a region B of FIG. 9.
Figure 11:
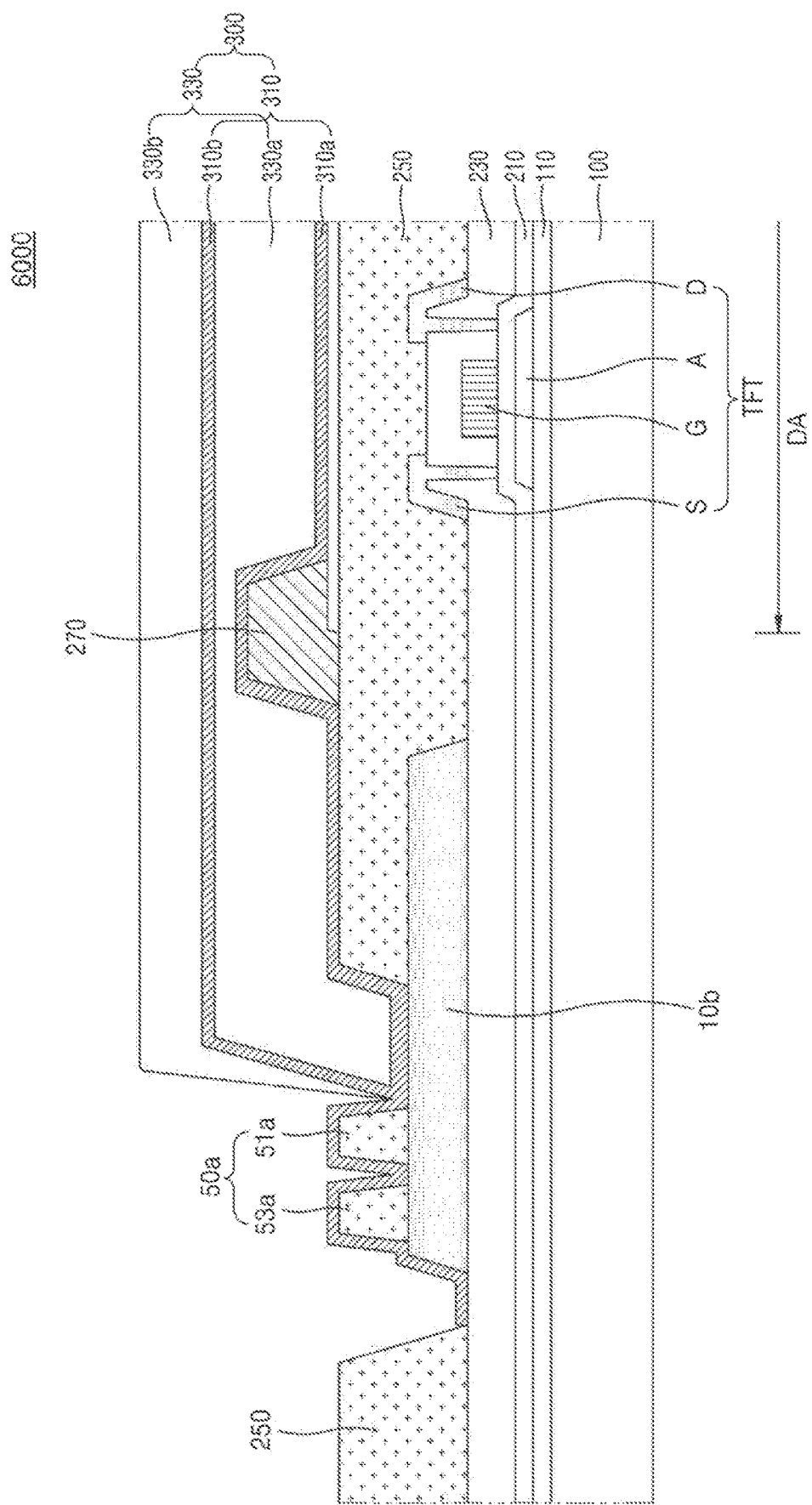
FIG. 11 is a schematic cross-sectional view taken along line X-X' of FIG. 11.

FIG. 9 is a schematic plan view of an OLED display 6000 according to another exemplary embodiment. FIG. 10 is a schematic enlarged plan view of a region B of FIG. 9. FIG. 11 is a schematic cross-sectional view taken along line X-X' of FIG. 11.

The same reference numerals between FIGS. 1 through 4 and FIGS. 9 through 11 denote the same elements, and thus redundant descriptions thereof are omitted for brevity of explanation.

The OLED display 6000 according to the present exemplary embodiment may include the substrate 100, the display unit 200 on the substrate 100, the thin-film encapsulation layer 300 for sealing the display unit 200, voltage lines 10b and 20 formed in a non-display area and surrounding a display area DA, and a dam unit 50 having at least a part contacting the voltage lines 10b and 20.

The first voltage line 10b may be disposed to correspond to at least one side of the display area DA. In this regard, the at least one side corresponding to the first voltage line 10b may be a side adjacent to the pad unit PAD.

The first voltage line 10b may include a pair of first connection units 12b connected to the pad unit PAD.

A metal layer may be disposed between the pair of first connection units 12b. The dam unit 50a may contact the metal layer between the first connection units 12b and may be integrally connected and continuously surround the display area DA.

As shown in FIG. 9, the metal layer of the OLED display 6000 according to the present embodiment is formed by extending the first voltage line 10b.

That is, the metal layer may not be provided between the first connection units 12b but may be formed by extending the first voltage line 10b to a blank area between the first connection units 12b when the first voltage line 10b is formed, so that a lower portion of the dam unit 50 may contact the first voltage line 10b between the first connection units 12b.

According to an exemplary embodiment, the first voltage line 10b is formed by extending in a way that metal is filled between the first connection units 12b without an empty space.

The first voltage line 10b may be formed by extending to an area in which a dam is at least formed outermost the dam unit 50a.

According to an exemplary embodiment, when the dam unit 50a includes the first dam 51a and the second dam 53a, the dam unit 50a is formed by extending to an area in which the second dam 53a is formed. Thus, lower portions of the first dam 51a and the second dam 53a may be adhered to the first voltage line 10b.

In the OLED display 6000 according to the present exemplary embodiment, the dam unit 50a completely contacts a lower portion of the first voltage line 10b between the first connection units 12b, thereby improving the adhesive strength of the dam unit 50a to reduce a probability that external moisture or oxygen may permeate and improving the reliability of the OLED.

The voltage lines 10b and 20 may include the second voltage line 20. The second voltage line 20 may include the pair of second end portions 21 bent to cover outer sides of the pair of first end portions 11. Each of the first end portions 11 may be disposed between the display area DA and the pair of second end portions 21.

The second voltage line 20 may include the pair of second connection units 22. The pair of first connection units 12b may extend in a direction perpendicular to (or crossing) the pair of first end portions 11. The pair of second connection units 22 may be formed in parallel to the pair of first connection units 12b and extend from the pair of second end portions 21.

The pair of first connection units 12b and the pair of second connection units 22 may be connected to the pad unit PAD outside the at least one side of the display area DA.

According to an exemplary embodiment, outer sides of the first voltage line 10b and the second voltage line 20 are located on the same line outside the display area DA of a side in which the first end portions 11 are disposed.

That is, the outer side of the first voltage line 10b may extend to the outer side of the second end portions 21 outside of the side in which the first end portions 11 are disposed in outer sides of four sides of the display area DA so that the outer sides of the first voltage line 10b and the second voltage line 20 may be located on the same line.

As shown in FIG. 11, the dam unit 50a is formed on the same layer and formed of the same material as that of the planarization layer 250.

The first dam 51a and the second dam 53a may have the same height but a height of the dam unit 50a is not limited thereto. The height of the second dam 53a located outside of the substrate 100 may be relatively higher than that of the first dam 51a.

As shown in FIG. 11, the first voltage line 10b extends to a lower portion of the second dam 53a, and the first voltage line 10b is provided between the dam unit 50a and a lower inorganic layer, and thus the dam unit 50a may contact the first voltage line 10b formed of a metal material, thereby improving the adhesive strength of the dam unit 50a.

Figure 12:
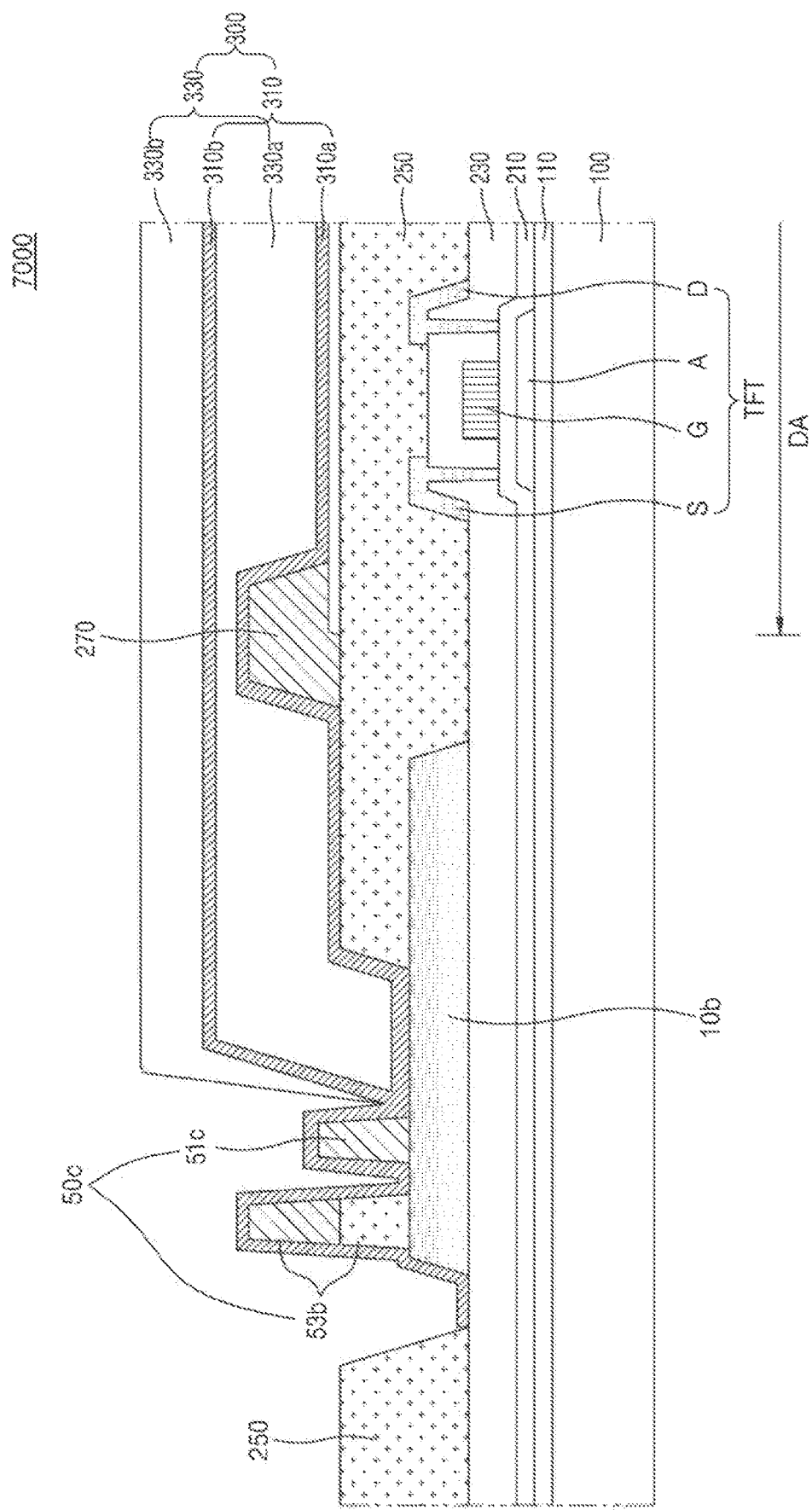
FIG. 12 is a cross-sectional view of an OLED display according to another exemplary embodiment.

FIG. 12 is a cross-sectional view of an OLED display 7000 according to another exemplary embodiment. The same reference numerals between FIGS. 1 through 6 and 12 denote the same elements, and thus redundant descriptions thereof are omitted for brevity of explanation.

In the OLED display 7000 according to the present exemplary embodiment, the first voltage line 10b extends to an area in which the second dam 53b is formed, and the first voltage line 10b is provided between the dam unit 50c and a lower inorganic layer, and thus the dam unit 50c may contact the first voltage line 10b formed of a metal material, thereby improving the adhesive strength of the dam unit 50c.

In the OLED display 7000 according to the present exemplary embodiment, the dam unit 50c includes the first dam 51c and the second dam 53b that have different heights. That is, the height of the second dam 53b located outside of the substrate 100 may be greater than that of the first dam 51c.

That is, when the planarization layer 250 is formed, a lower portion of the dam unit 53b may be formed with the planarization layer 250, and then, when the pixel-defining layer 270 is formed, the first dam 51c and an upper portion of the second dam 53b may be formed with the pixel-defining layer 270.

According to an exemplary embodiment, a part of the dam unit 51b formed on the same layer as the planarization layer 250 and a part of the dam unit 51b formed on the same layer as the pixel-defining layer 270 are formed of the same material and integrally formed.

No organic layers may be formed between the first dam 51c and the second dam 53b, and the organic layer 330 may be formed inside the first dam 51c, thereby efficiently preventing permeation of external moisture.

A lower portion of the second dam 53b formed on the same layer as the planarization layer 250 and an upper portion thereof formed on the same layer as the pixel-defining layer 270 may be formed of the same material and integrally formed.

As described above, according to the one or more of the exemplary embodiments, reliability is improved by effectively preventing external moisture or oxygen from permeating.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. An organic light-emitting diode (OLED) display, comprising:
   a substrate comprising a display area and a non-display area, wherein the substrate extends in a first direction and a second direction that crosses the first direction;
   a buffer layer on the substrate;
   a plurality of thin film transistors (TFT) on the buffer layer, the thin film transistor comprising an active layer, a gate electrode, a source electrode and a drain electrode;
   a plurality of OLEDs that include a plurality of light emitting layers between a plurality of lower electrodes and an upper electrode on the substrate;
   a thin film encapsulation layer on the upper electrode;
   a dam disposed in the non-display area and surrounds the display area;
   a first voltage line disposed in the non-display area, wherein the first voltage line includes a first region and a second region arranged along the first direction; and
   a second voltage line disposed in the non-display area, wherein the second voltage line extends in the first direction adjacent to the first region, but does not extend in the first direction adjacent to the second region,
   wherein the first region and the second region each have a first width and a second width in the second direction, and the second width is greater than the first width, and
   wherein the dam overlaps the second region of the first voltage line in a plan view.

2. The OLED display of claim 1, wherein the dam includes a first dam and a second dam that surrounds the first dam.

3. The OLED display of claim 2, wherein the second dam has a different height than the first dam.

4. The OLED display of claim 2, wherein the first dam is provided in one layer, and the second dam is provided in two layers.

5. The OLED display of claim 1, wherein the thin film encapsulation layer includes at least one inorganic layer and at least one organic layer, and wherein the at least one organic layer is located inside the dam.

6. The OLED display of claim 5, wherein the at least one inorganic layer has a portion located outside the dam.

7. The OLED display of claim 1, further comprising a planarization layer disposed between the OLEDs and the TFT, wherein the planarization layer covers a side of the first voltage line.

8. The OLED display of claim 7, wherein the planarization layer extends from the display area and is spaced apart from the dam.

9. The OLED display of claim 1, further comprising a pixel defining layer on the substrate, the pixel defining layer partially exposing the lower electrodes, wherein the dam is provided in the same layer as the pixel-defining layer.

10. An organic light-emitting diode (OLED) display, comprising:
    a substrate that comprises a display area and a non-display area;
    an OLED and a thin film transistor (TFT) disposed on the display area;
    a first voltage line disposed in the non-display area and is adjacent to one side of the display area, wherein the first voltage line comprises a first region and second region, the first region comprises a first side that faces the display area and a second side opposite to the first side, and the second region comprises a third side that faces the display area and a fourth side opposite to the first side, wherein the second side closer than fourth side to the display area;
    a second voltage line disposed in the non-display area and comprises a portion that is adjacent to the first region of the first voltage line; and
    a dam disposed in the non-display area and that surrounds the display area,
    wherein the dam overlaps a portion of the second voltage line and the second region of the first voltage line in a plan view.

11. The OLED display of claim 10, wherein the portion of the second voltage line is disposed outside the first region of the first voltage line.

12. The OLED display of claim 10, wherein the second voltage line comprises a fifth side that faces the second side of the first voltage line and a sixth side opposite to the fifth side.

13. The OLED display of claim 12, wherein the dam covers the sixth side of the second voltage line.

14. The OLED display of claim 10, further comprising a thin film encapsulation layer that covers the OLED, wherein the thin film encapsulation layer includes at least one inorganic layer and at least one organic layer, and wherein the at least one organic layer is located inside the dam.

15. The OLED display of claim 14, wherein the at least one inorganic layer has a portion located outside the dam.

16. The OLED display of claim 10, further comprising a planarization layer disposed between the OLED and the TFT, wherein the planarization layer covers the first side of the first region and the third side of the second region of the first voltage line.

17. The OLED display of claim 16, wherein the planarization layer extends from the display area and is spaced apart from the dam.

18. The OLED display of claim 16, wherein the dam is provided in two layers.

19. The OLED display of claim 16, wherein the dam is provided in the same layer as the planarization layer.

20. The OLED display of claim 10, the OLED includes a light emitting layer between a lower electrode and an upper electrode on the substrate.

\* \* \* \* \*